(12) United States Patent
Katane et al.

(10) Patent No.: US 7,557,346 B2
(45) Date of Patent: Jul. 7, 2009

(54) SCANNING ELECTRON MICROSCOPE

(75) Inventors: Junichi Katane, Naka (JP); Sukehiro Ito, Hitachinaka (JP)

(73) Assignees: Hitachi High-Technologies Corporation, Tokyo (JP); Hitachi High-Tech Science Systems, Ibaraki (JP)

(*) Notice: Subject to any disclaimer, the term of this patent is extended or adjusted under 35 U.S.C. 154(b) by 302 days.

(21) Appl. No.: 11/717,093

(22) Filed: Mar. 13, 2007

(65) Prior Publication Data

US 2008/0073534 A1 Mar. 27, 2008

(30) Foreign Application Priority Data

Mar. 14, 2006 (JP) ............................. 2006-068474

(51) Int. Cl.
*H01J 37/28* (2006.01)
*H01J 37/244* (2006.01)

(52) U.S. Cl. ....................................... 250/310; 250/397

(58) Field of Classification Search ................. 250/310, 250/307, 397

See application file for complete search history.

(56) References Cited

U.S. PATENT DOCUMENTS

| 4,897,545 | A | 1/1990 | Danilatos |
| 6,590,210 | B1* | 7/2003 | Essers .................. 250/397 |
| 6,809,322 | B2* | 10/2004 | Danilatos ............... 250/310 |

FOREIGN PATENT DOCUMENTS

| JP | 9-320504 | 12/1997 |
| JP | 2002-75264 | 3/2002 |

* cited by examiner

*Primary Examiner*—Jack I Berman
(74) *Attorney, Agent, or Firm*—McDermott Will & Emery LLP

(57) ABSTRACT

A scanning electron microscope capable of securing a high ion detection efficiency in spite of a short working distance and the adaptability for high resolution is disclosed. An ion detector for detecting ions is arranged nearer to an electron source than a first pressure limiting aperture for maintaining the specimen chamber in a predetermined vacuum. This configuration makes it possible to achieve the high resolution of the semi-in-lens objective lens on one hand and to detect the ions generated by the collision between the secondary electrons and the gas molecules on the other hand.

6 Claims, 4 Drawing Sheets

SCANNING ELECTRON MICROSCOPE

BACKGROUND OF THE INVENTION

This invention relates to a scanning electron microscope, or in particular, to a scanning electron microscope adapted for detecting the charged particles generated in low vacuum.

Some objects to be observed under the scanning electron microscope contain moisture and cannot be placed in high vacuum. To observe such objects, what is called a low-vacuum scanning electron microscope is used in which the atmosphere in the specimen chamber with a specimen arranged therein is maintained in low vacuum as compared with the high vacuum around the electron source.

In order to maintain the specimen chamber in low vacuum, a pressure limiting aperture to selectively keep the specimen chamber in low vacuum is arranged between the specimen chamber and the high vacuum area. This pressure limiting aperture has an opening sufficient to pass the electron beam.

With regard to the scanning electron microscope having the pressure limiting aperture, techniques for improving the detection efficiency of secondary electrons and reflected electrons are described in JP-A-9-320504 and JP-A-2002-75264.

According to JP-A-9-320504, the pressure limiting aperture is arranged on the principal plane of the objective lens, so that the trajectory of the reflected electrons diffused in the gas atmosphere is restricted on the electron beam optical axis by an objective lens magnetic field and detected by a reflected electron detector arranged in the neighborhood of the pressure limiting aperture.

According to JP-A-2002-75264, on the other hand, the secondary electrons are converged on the optical axis by the magnetic field of the objective lens, and after being passed through the pressure limiting aperture, detected by a secondary electron detector arranged on the pressure limiting aperture.

The scanning electron microscopes having an pressure limiting aperture disclosed in JP-A-9-320504 and JP-A-2002-75264 are both intended to detect the secondary electrons or the reflected electrons but not to detect the ions generated by the collision of the secondary electrons released from the specimen with gas molecules.

The lens described in JP-A-9-320504 is called the semi-in-lens or the lower-pole-open lens known to have a structure suitable for observation of a large specimen with high resolution in view of the fact that the specimen can be placed in the lens magnetic field and therefore the distance between the principal plane of the lens and the specimen (working distance (WD)) can be shortened accordingly.

These conventional techniques, however, pose the problem that the lens magnetic field leads the secondary electrons released from the specimen onto the objective lens, and therefore, the detection under the objective lens in the gas atmosphere is difficult.

SUMMARY OF THE INVENTION

The object of this invention is to provide a scanning electron microscope short in WD and adapted for high resolution application which is capable of detecting ions with high efficiency.

In order to achieve this object, according to this invention, there is provided a scanning electron microscope having an ion detector arranged nearer to an electron source than a first pressure limiting aperture to maintain the specimen chamber in a predetermined vacuum.

With the aforementioned configuration, both the high resolution with the semi-in-lens objective lens and the detection of ions generated by the collision between the secondary electrons and the gas molecules can be achieved at the same time.

Other objects, features and advantages of the invention will become apparent from the following description of the embodiments of the invention taken in conjunction with the accompanying drawings.

DETAILED EXPLANATION OF THE INVENTION

Figure 1:
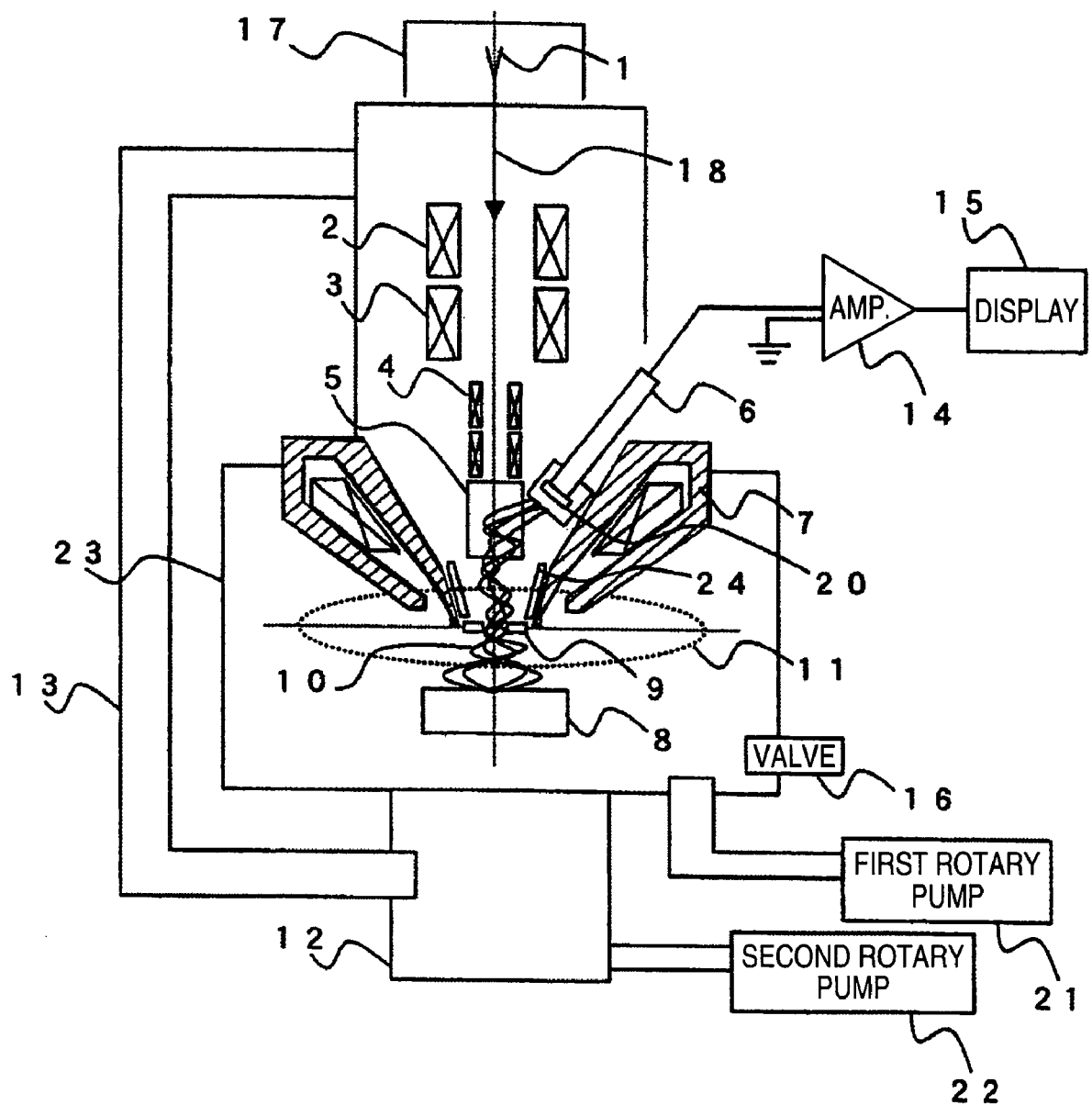
FIG. 1 is a diagram showing an example of the optical system of the scanning electron microscope.

An embodiment of the invention is explained below with reference to the drawings. FIG. 1 is a diagram showing an example of the electron optical system of the scanning electron microscope.

An electron gun (electron source) 17 is impressed with an accelerating voltage of, say, several V to several kV, and electron beams generated from a filament 1 increased in temperature by the current of about 2 A form into a primary electron beam 18.

After that, the primary electron beam is reduced by a first condenser lens 2 and a second condenser lens 3 into a probe current of several µA to several pA. The electrons, passing through a deflection coil 4 and an energy separator (E×B) 5, are focused on the specimen by the semi-in-lens objective lens 7. The primary electron beam thus focused is scanned on the specimen, and the secondary electrons 10 generated from the specimen 8 are forced up by the objective lens magnetic field 11 generated from the semi-in-lens objective lens and oozed out toward the specimen. Then, the secondary electrons 10 are accelerated to several hundred V by an electrode 24 arranged in the lens. After that, the secondary electrons are separated from the primary electrons in an energy separator (E×B).

The secondary electron detector 6 includes an electrode 20 impressed with the voltage of about 10 kV. The secondary electrons 10 are retrieved by the detector in the electric field due to this electrode and, through a secondary electron detector amplifier 14, formed into an image on a display 15. In low-vacuum observation, the interior of the specimen chamber 23 is regulated by a first needle valve 16 and evacuated into a vacuum of 1 Pa to about 3000 Pa by a secondary rotary pump 21.

The high evacuation system 12 is connected to an electron gun through an electron gun exhaust pipe 13, and the pressure in the specimen chamber and the electron gun are differentiated by the first pressure limiting aperture 9. As a result, the electron gun can be maintained at 10-2 to 10-4 Pa.

The electron optical system shown in FIG. 1 employs a tungsten thermal electron gun. Also, the secondary electrons generated from the specimen are forced up onto the objective lens by the magnetic field generated by the objective lens, and then, the electrons are captured by the detector above (or in or under) the objective lens thereby to acquire an image. The pressure limiting aperture is arranged in the neighborhood of the principal plane of the objective lens, so that the electron beam path is set in high vacuum, and the specimen chamber with the specimen arranged therein is set in low pressure.

With this configuration, the electron optical system explained in this example makes possible the observation with the high resolution of not lower than 3 nm as well as the observation in both high and low vacuums.

The pressure limiting aperture described with reference to this embodiment is arranged at a position not interfering with the trajectory of the secondary electron trajectory forced up onto the objective lens. This pressure limiting aperture is a vacuum type indispensable for low-vacuum control and formed of a circular aperture plate having an aperture about $\phi$ 0.1 mm to $\phi$ 0.5 mm in diameter.

Figure 2:
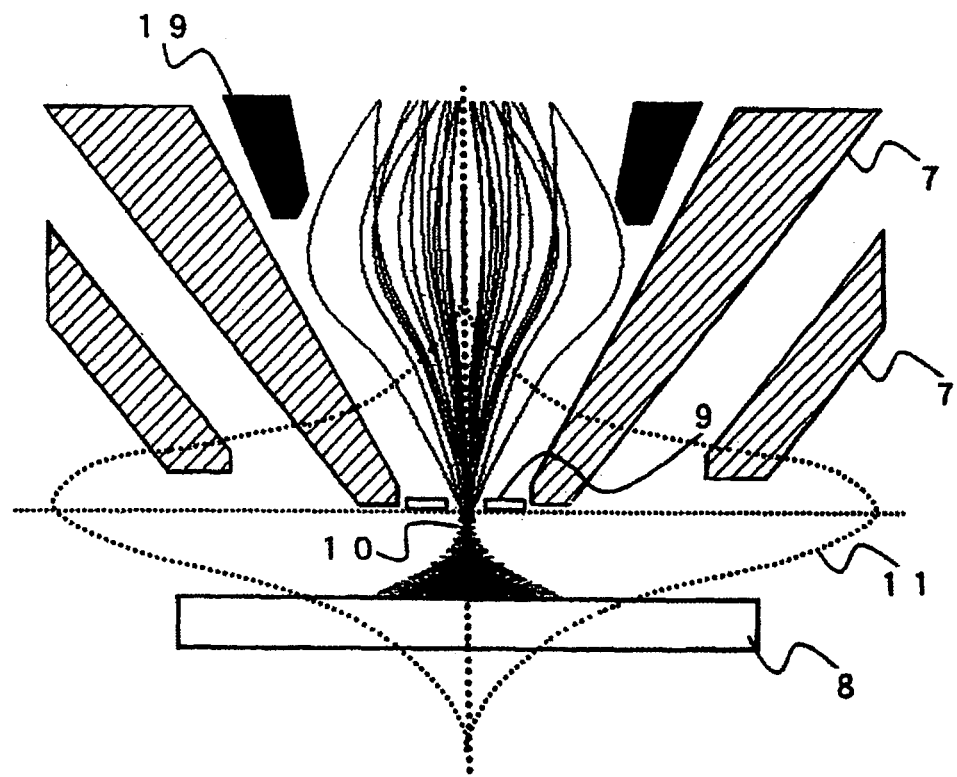
FIG. 2 is a diagram showing a simulation trajectory with the secondary electrons forced up onto the objective lens.

FIG. 2 shows a simulation trajectory along which the secondary electrons are forced up onto the objective lens by the magnetic field generated by the objective lens.

In this simulation, the energy of the secondary electrons generated from the specimen is assumed to be 2 eV to 50 eV, and the secondary electrons are generated in the direction of 0° to 90° with respect to the z axis as the optical axis. From the result shown in FIG. 2, it is understood that the secondary electrons generated from the specimen are converged at a certain position. This position is where the axial magnetic field of the objective lens is maximum, and It can be predicted that the secondary electrons forced up are converged at this position and accelerated toward the energy separator by the electrode arranged in the lens.

From the result described above, by arranging the pressure limiting aperture at the position of the maximum axial magnetic field of semi-in-lens objective lens, the secondary electrons released from the specimen and passing through the objective lens is prevented from hampering the force-up operation by the convergence due to the magnetic field generated by the secondary electrons.

With this configuration, the trajectory of the secondary electrons is not interfered with, and therefore, the reduction in the secondary electron detection efficiency can be suppressed.

Figure 3:
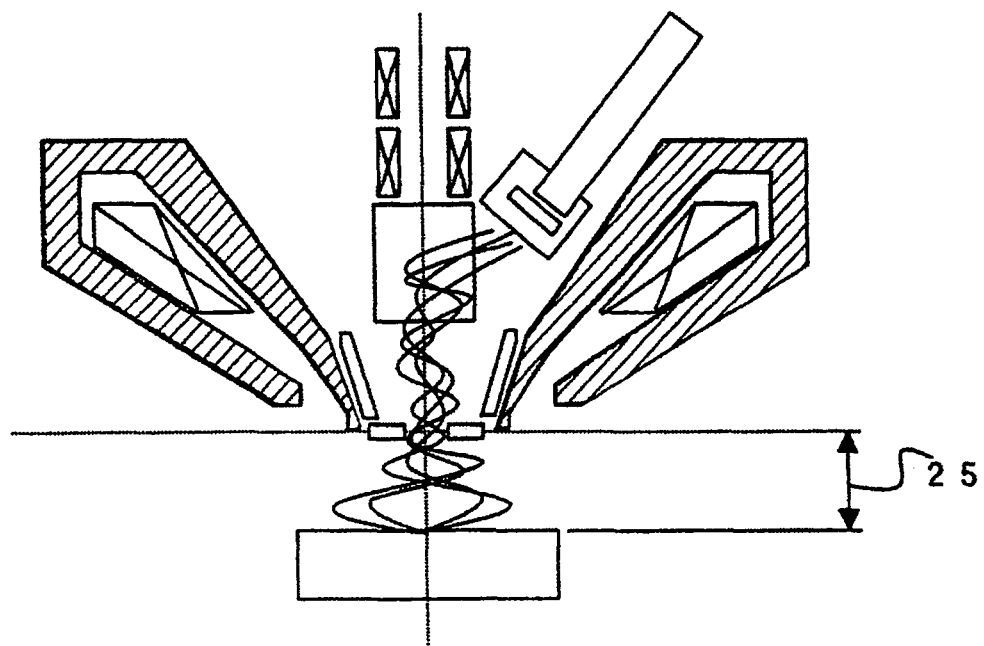
FIG. 3 is a diagram for explaining an example in which the specimen arranged in the specimen chamber maintained in low vacuum is observed using the semi-in-lens objective lens.

FIG. 3 is a diagram for explaining an example in which the specimen arranged in the specimen chamber maintained in low vacuum is observed using the semi-in-lens objective lens, or especially, the relative positions of the specimen and the pressure limiting aperture.

The semi-in-lens objective lens shown in FIG. 3, as explained above with reference to the electron optical system, has the generated magnetic field with the magnetic field oozed out toward the specimen, and therefore, the distance between the magnetic pole and the specimen can be shortened. Of course, the nearer to the lens, the smaller the effect of the spherical aberration and the chromatic aberration. By minimizing the distance between the specimen and the lens, therefore, the blur can be minimized and the observation still higher in resolution is made possible.

What is feared in low vacuum, on the other hand, is the scatter of the primary electron beam and the gas molecules. Before and after the first pressure limiting aperture 9, depending on the vacuum degree in the specimen chamber, the pressure is different by about several tens of Pa to several hundred Pa. Thus, the primary electron beam, though proceeding in a comparatively high vacuum atmosphere before the pressure limiting aperture, proceeds in low vacuum after the pressure limiting aperture.

By minimizing the distance over which the electron beam proceeds in low vacuum, i.e. the distance 25 between the specimen and the pressure limiting aperture, therefore, the scatter of the primary electron beam and the gas molecules can be minimized.

The conditions for minimizing the distance between the magnetic pole and the specimen and the distance between the pressure limiting aperture and the specimen are met by arranging the pressure limiting aperture at the axial maximum magnetic field point of the objective lens. Thus, the axial maximum magnetic field point is defined as the position of the pressure limiting aperture on the one hand and the positions of the pressure limiting aperture and the specimen where the scatter of the primary electron beam proceeding in low vacuum can be suppressed on the other hand.

In view of the conditions described above, the scanning electron microscope in which the efficiency of detecting the ions generated by the collision between the gas molecules and the secondary electrons is explained below.

The principle of the gas amplification-type ion detection method in this example is explained. As explained with reference to FIG. 4, in the gas amplification-type detection method, the secondary electrons 31 generated from the specimen are accelerated by the electrode 26 impressed with a positive voltage (say, several hundred volts) and rendered to collide with the gas molecules existing in the low vacuum atmosphere in an avalanche.

As a result, the secondary electrons repeat the gas amplification, and the gas molecules collided are retrieved by the ion detector 28 as ions 29 carrying the image information. The resulting electrons form an image on a display 15 through an amplifier 30. The image thus obtained is similar to the image of the secondary electrons in high vacuum and therefore also called the low-vacuum secondary electron image.

According to this embodiment, even in the case where the semi-in-lens for realizing a high resolution is employed, the ion detector is arranged nearer to the electron source than the principal plane of the objective lens to detect the ions generated by the collision between the gas molecules and the secondary electrons with high efficiency. Thus, the realization of the high resolution due to the use of the semi-in-lens and the ion detection with high efficiency can be achieved at the same time.

Also, according to this embodiment, in order to realize the ion detection with higher efficiency, the vacuum degree of the space in which the ion detector is arranged is set to an appropriate value. The present inventors have found that the ions generated by the collision of the secondary electrons with the gas molecules can be amplified most optimally in the space of about 10 Pa to 150 Pa.

In the case where the vacuum degree is higher than this range, the gas molecules are sufficiently existent, and the ions generated are not great in number. In a vacuum lower than the aforementioned range, therefore, the primary electron beam is scattered by the gas molecules. By arranging the ion detector in the space of about 10 Pa to 150 Pa, however, the primary electron beam can be prevented from being scattered while at the same time improving the ion detection efficiency.

An example suitable for arranging the ion detector under these conditions is explained with reference to FIG. 4.

Figure 4:
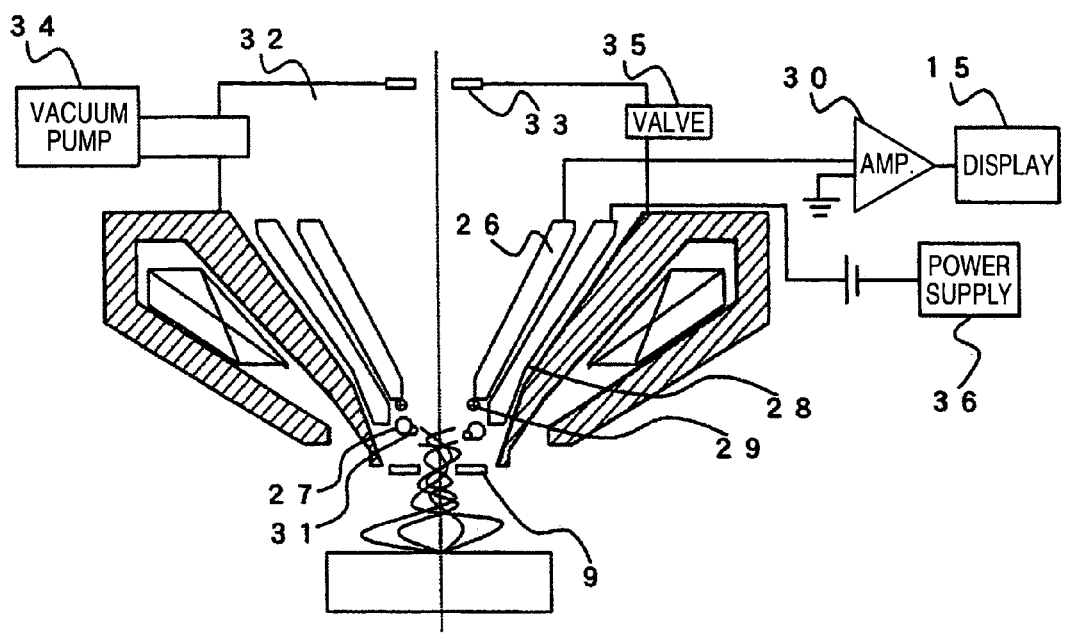
FIG. 4 is a diagram for explaining an example in which the pressure limiting aperture is interposed between the ion detector and the electron source.

FIG. 4 is a diagram for explaining an example of the configuration in which a second pressure limiting aperture 33 is arranged between a gas amplification-type ion detecting electrode 28 and an electron source to amplify the ions by the collision between the gas molecules and the secondary electrons with high efficiency. The opening diameter of the second pressure limiting aperture 33 is equal to or smaller than the opening diameter of the first pressure limiting aperture 9. With this configuration, a space suitable for ion amplification can be formed between the first pressure limiting aperture 9 and the second pressure limiting aperture 33.

The vacuum degree in the specimen chamber may be varied within the range of about 1 Pa to 3000 Pa according to the type and conditions for observation of the specimen. Regardless of the change in vacuum degree of the specimen chamber, a space of stable gas atmosphere can be formed.

Further, according to this embodiment, a sufficient distance can be secured for the secondary electrons to pass through the gas atmosphere even in the case where the WD is shortened, and therefore, the observation with high resolution and the ion detection with high efficiency are possible at the same time.

Also, according to this embodiment, in order to form a predetermined vacuum atmosphere between the first pressure limiting aperture 9 and the second pressure limiting aperture 33, a vacuum pump 34 and a second needle valve 35 are arranged in the in-lens vacuum chamber 32 (the space between the first pressure limiting aperture 9 and the second pressure limiting aperture 33). By adjusting these component elements properly, the vacuum degree in the in-lens vacuum chamber 32 can be properly set.

Figure 5:
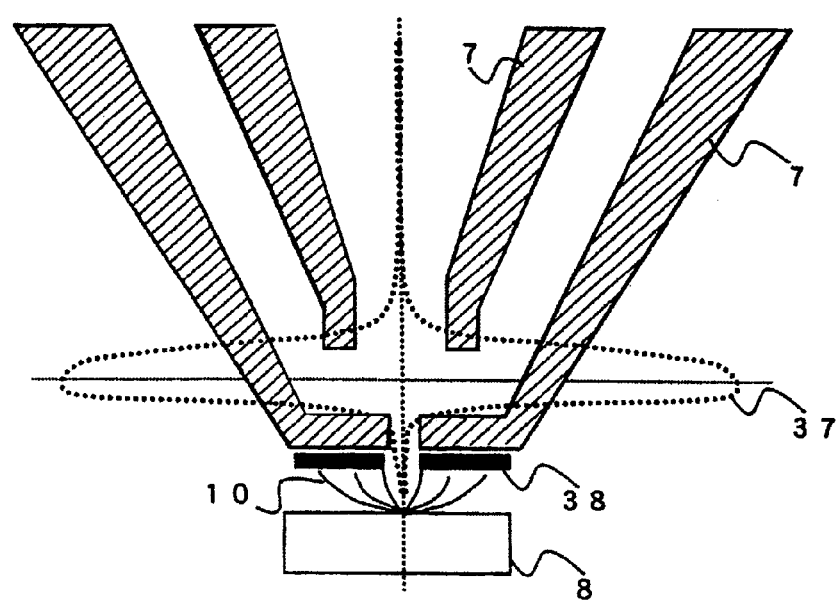
FIG. 5 is a diagram for explaining an ordinary gas amplification-type ion detection method.

FIG. 5 is a diagram for explaining an ordinary gas amplification-type ion detection method. The ions generated by the collision between the gas molecules and the secondary electrons 10 led by the electrode 38 impressed with several hundred volts are detected, and an image formed based on the ion detection.

Figure 6:
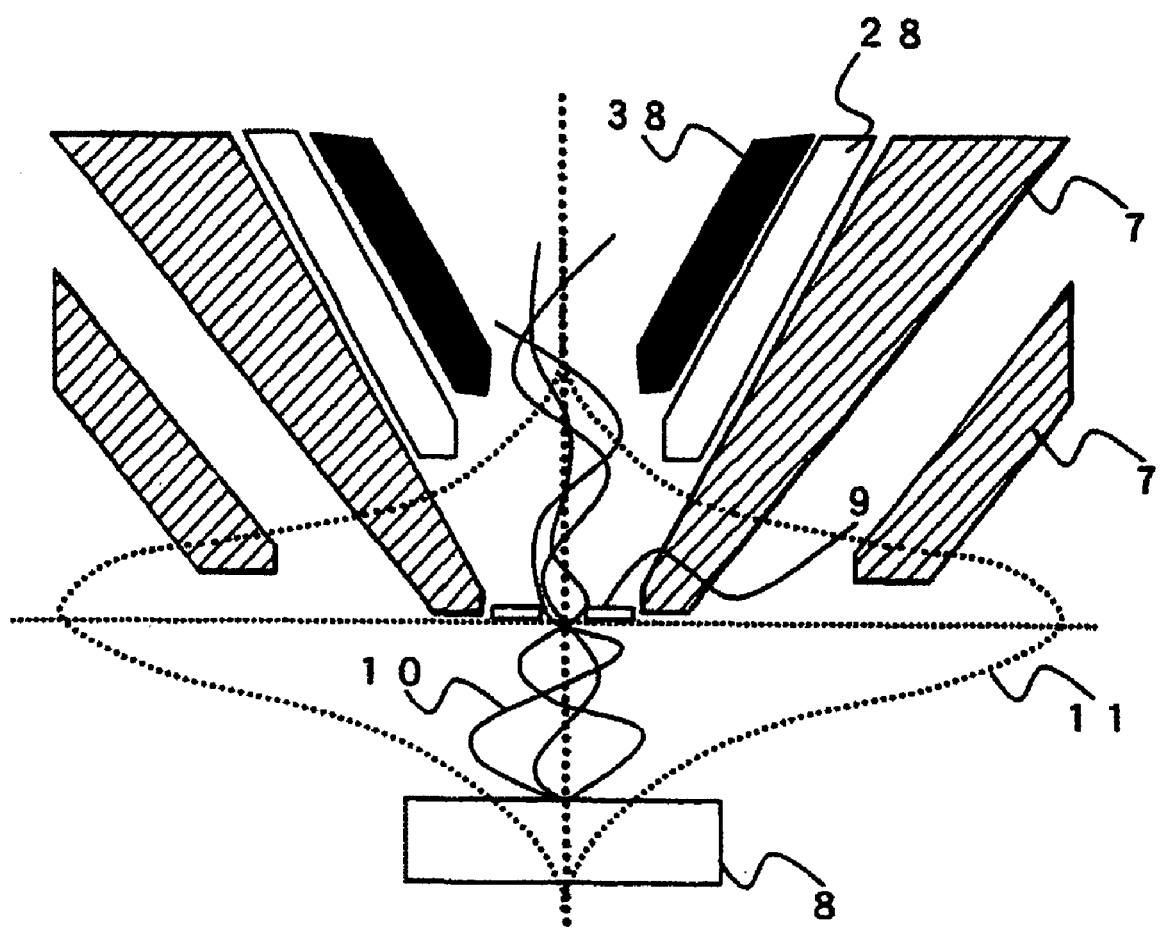
FIG. 6 is a diagram for explaining an example in which the force-up effect of the magnetic field is used for improving the detection efficiency of the gas amplification-type ion detection method.

FIG. 6 shows an example in which the force-up effect by the magnetic field is used for improving the detection efficiency in the gas amplification-type ion detection method.

The secondary electrons accelerated by the electrode 38 are led along the direction of the ideal optical axis of the primary electron beam by the secondary electron force-up operation of the magnetic field generated by the semi-in-lens objective lens. The interaction between the electric field and the magnetic field moves the secondary electrons in the gas atmosphere. As compared with the case shown in FIG. 5, a longer distance is covered by the secondary electrons in the gas atmosphere, and in this process, the secondary electrons collide with the gas molecules repeatedly. Therefore, a great number of ions are generated, thereby contributing to the highly efficient ion detection.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope comprising:
   an electron source;
   an objective lens for focusing the electron beam emitted from the electron source on a specimen;
   a specimen chamber with the specimen arranged therein;
   a first pressure limiting aperture having an opening for passing the electron beam to maintain the specimen chamber at a predetermined vacuum degree; and
   an ion detector arranged nearer to the electron source than the principal plane of the objective lens to detect the ions generated by the collision between the secondary electrons released from the specimen and the gas molecules;
   wherein the first pressure limiting aperture is arranged in the lens magnetic field formed by the objective lens.

2. A scanning electron microscope according to claim 1, wherein a second pressure limiting aperture having an opening for passing the electron beam is arranged between the ion detector and the electron source.

3. A scanning electron microscope according to claim 2, further comprising:
   a vacuum pump for evacuating the space between the first pressure limiting aperture and the second pressure limiting aperture.

4. A scanning electron microscope according to claim 2, wherein a gas atmosphere is formed between the first pressure limiting aperture and the second pressure limiting aperture, and maintained in such a state that ions are generated by the collision with the secondary electrons released from the specimen.

5. A scanning electron microscope according to claim 2, wherein the pressure of the space between the first pressure limiting aperture and the second pressure limiting aperture is regulated to a value between 10 Pa and 150 Pa.

6. A scanning electron microscope according to claim 1, further comprising:
   an electrode for attracting the secondary electrons is arranged between the principal plane of the lens and the first pressure limiting aperture.

\* \* \* \* \*